United States Patent [19]

Chang et al.

[11] Patent Number: 4,769,340
[45] Date of Patent: Sep. 6, 1988

[54] A METHOD FOR MAKING ELECTRICALLY PROGRAMMABLE MEMORY DEVICE BY DOPING THE FLOATING GATE BY IMPLANT

[75] Inventors: Thomas T. L. Chang, Santa Clara; Chun Ho, Cupertino; Arun K. Malhotra, Mt. View, all of Calif.

[73] Assignee: Exel Microelectronics, Inc., San Jose, Calif.

[21] Appl. No.: 853,019

[22] Filed: Apr. 17, 1986

Related U.S. Application Data

[62] Division of Ser. No. 556,028, Nov. 28, 1983, abandoned.

[51] Int. Cl.$^4$ .......................................... H01L 21/425
[52] U.S. Cl. ........................................ 437/52; 437/26
[58] Field of Search ................ 29/571, 591, 576 B; 365/185; 357/23.5; 437/52, 26

[56] References Cited

U.S. PATENT DOCUMENTS

| | | | |
|---|---|---|---|
| 4,203,158 | 5/1980 | Frohman-Bentchkowsky et al. | 365/185 |
| 4,373,248 | 2/1983 | McElroy | 357/23.5 X |
| 4,373,249 | 2/1983 | Kosa et al. | 148/187 X |
| 4,375,087 | 2/1983 | Wanless | 365/218 |
| 4,376,947 | 3/1983 | Chiu et al. | 357/23 |
| 4,409,723 | 10/1983 | Harari | 29/571 |
| 4,420,871 | 12/1983 | Scheibe | 29/571 |
| 4,451,904 | 5/1984 | Sugiura et al. | 357/23.5 X |
| 4,471,373 | 9/1984 | Shimizu et al. | 357/23.5 X |
| 4,490,900 | 1/1985 | Chiu | 29/571 |
| 4,597,159 | 7/1986 | Usami et al. | 29/571 |
| 4,630,086 | 12/1986 | Sato et al. | 357/23.5 X |

OTHER PUBLICATIONS

R. B. Marcus et al., "Polysilicon/SiO$_2$ Interface Microtexture and Dielectric Breakdown", J. Electrochem. Soc., vol. 129, No. 6; Jun. 1982; pp. 1282–1289.
William S. Johnson et al., "THPM 12.6: A 16Kb Electrically Erasable Nonvolatile Memory", Feb. 14, 1980/EEE International Solid-State Circuits Conference, pp. 152–153.
K. Saraswat et al., "9. Thermal Oxidation of Polycrystalline Silicon" pp. 244–259.

Primary Examiner—George T. Ozaki
Attorney, Agent, or Firm—Limbach, Limbach & Sutton

[57] ABSTRACT

In the present invention, asperity in the floating gate of an EPROM or EEPROM device is reduced. An improved process for fabricating ultrahigh coupling interpoly isolation dielectrics comprising a structure of oxide-nitride-oxide is disclosed. The first oxide is grown on undoped LPCVD polycrystalline silicon (polysilicon) to reduce the grain boundary-oxidation enhancement effect at the interface of floating gate polysilicon and interpoly oxide. This results in much higher breakdown capability of interpoly dielectrics. As a consequence, the shrinkage of the interpoly electrical thickness to an extent far beyond current limitation becomes possible. Implanted dopants through interpoly oxide into the floating gate polysilicon also eliminate the oxidation enhanced diffusion from conventional POCl$_3$ doped polysilicon into tunnel oxide. The phosphorus induced trap in the tunnel oxide region are reduced. The EEPROM threshold window can remain open beyond $10^6$ cycles.

18 Claims, 3 Drawing Sheets

EPROM

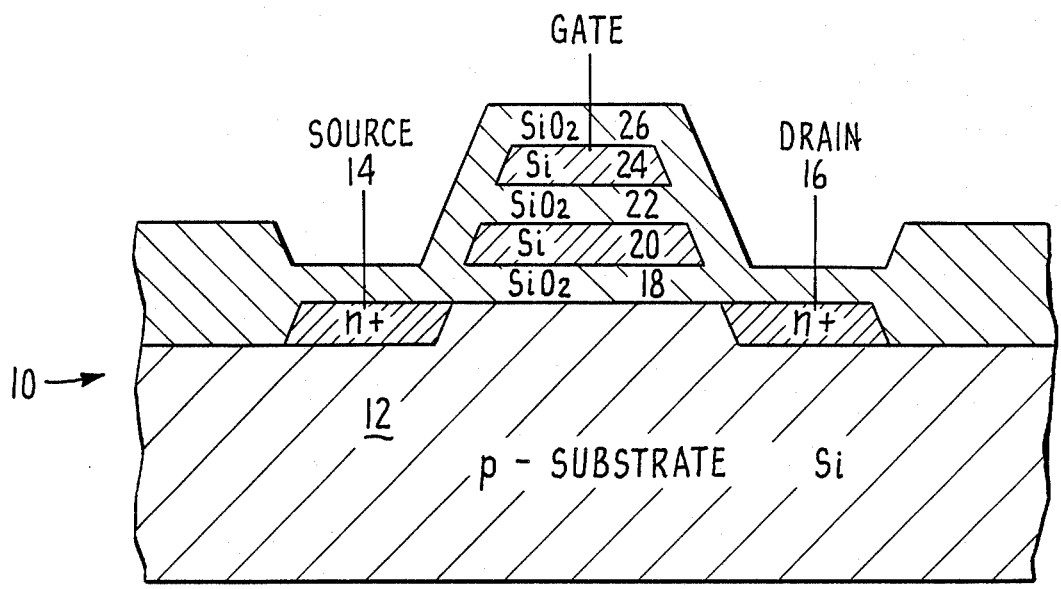
FIG. 1. EPROM
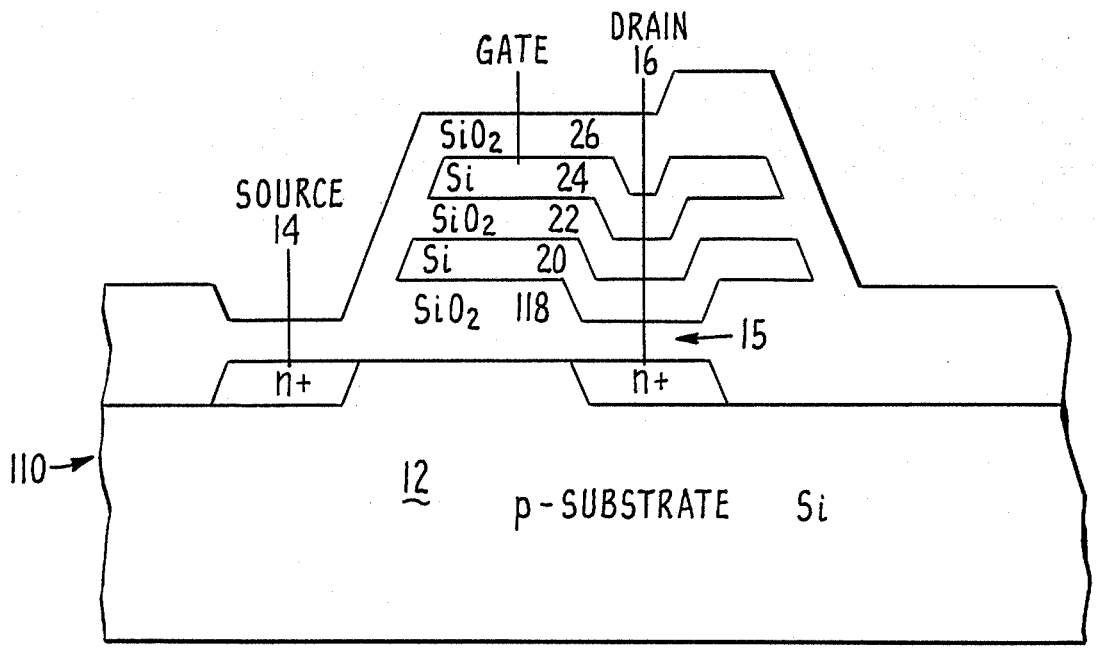
FIG. 2. EEPROM
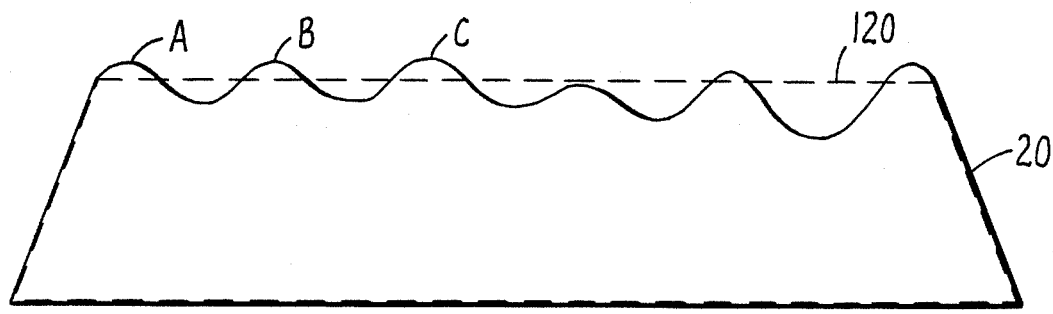
FIG. 3.

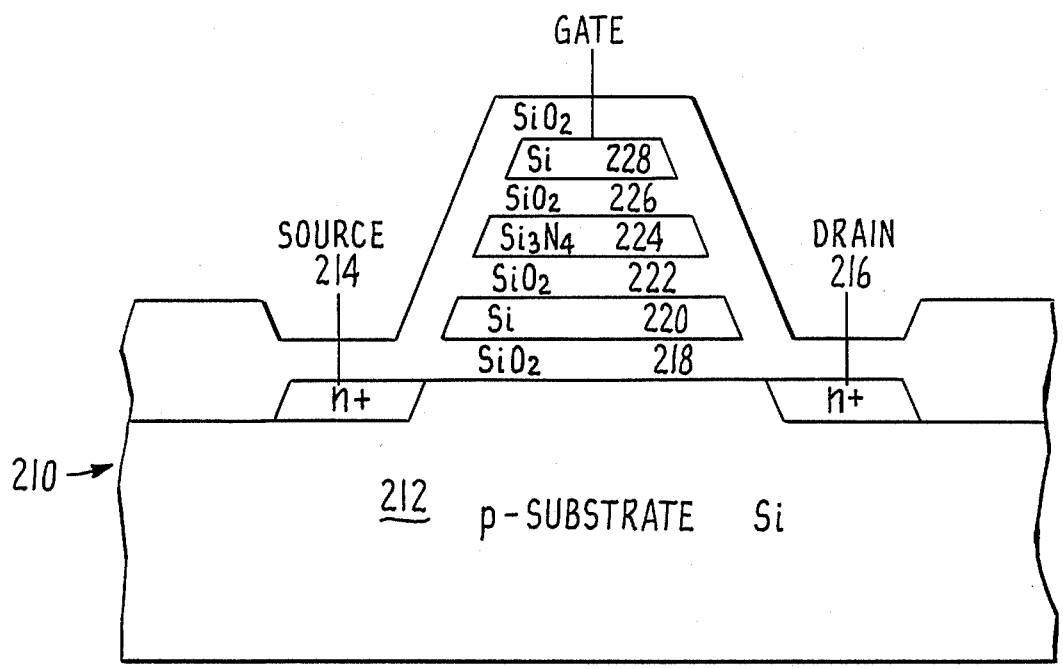
FIG. 4. EPROM
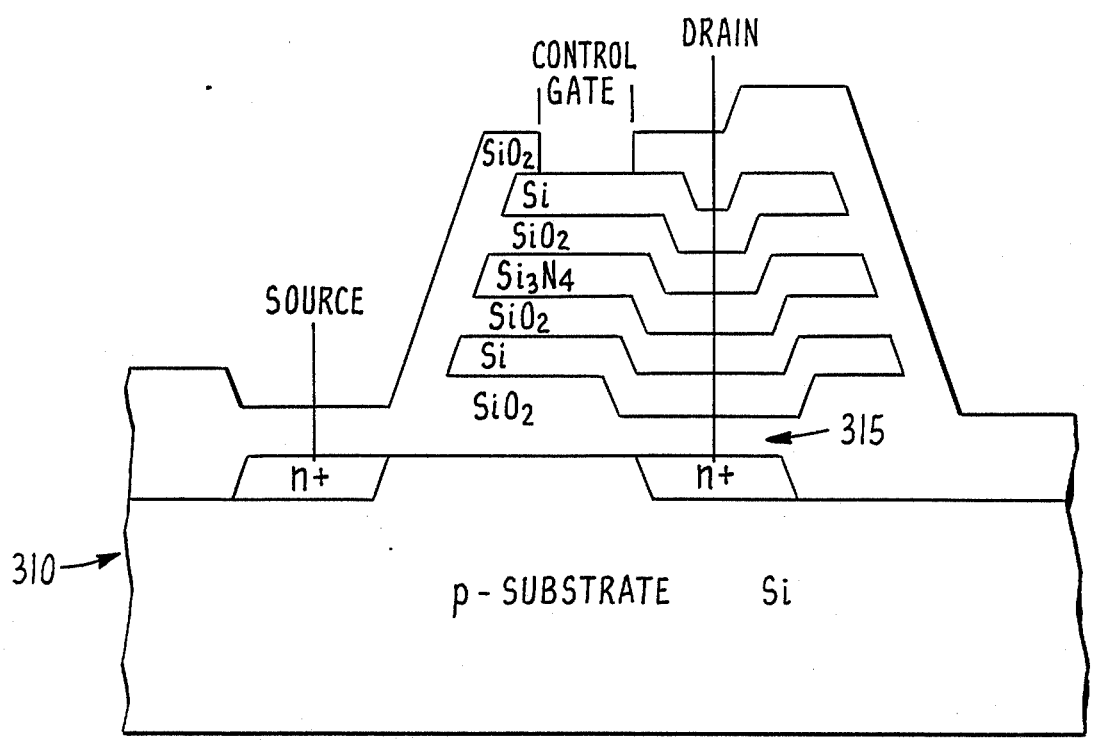
FIG. 5. EEPROM

A METHOD FOR MAKING ELECTRICALLY PROGRAMMABLE MEMORY DEVICE BY DOPING THE FLOATING GATE BY IMPLANT

The present application is a divisional of our co-pending U.S. patent application Ser. No. 06/556,028 entitled "An Electrically Programmable Memory Device And Method For Making The Same", filed Nov. 28, 1983 now abandoned.

TECHNICAL FIELD

The present invention relates generally to a method for making an electrically programmable memory device. More particularly, the present invention relates to the manufacture of ultra high coupling interpoly dielectrics suitable for programming Electrically Programmable Read-Only Memory (hereinafter "EPROM") and Electrically Erasable Programmable Read-Only Memory (hereinafter "EEPROM").

BACKGROUND OF THE INVENTION

EPROM or EEPROM and methods for making the same are well known in the art. In general, an EPROM or an EEPROM is characterized by a "floating gate" and a electrical connection termed "control gate", both of which are fabricated out of polycrystalline silicon doped with an appropriate doping material to render the polycrystalline silicon conductive. A typical doping material is phosphorus. The floating gate and the control gate are separated by a layer of insulating material, typically silicon dioxide ($SiO_2$). The principle upon which the EPROM or EEPROM device operates is that charges are stored on the "floating gate" in a capacitive manner. Thus, the dielectric of the layer of silicon dioxide between the floating gate and the control gate is important.

In the prior art (see for example, U.S. Pat. No. 4,203,158 and W. S. Johnson et al. *ISCCC Digest of Technical Papers*, pp. 152-153 (February 1980)), the floating gate is formed by reacting $SiH_4$ in a low pressure chemical vapor deposition chamber and then doped with $POCl_3$. A layer of silicon dioxide is then deposited, or thermally grown, on the doped polycrystalline layer of silicon. The layer of silicon dioxide is typically approximately 750 Angstroms. Generally, a high oxidation temperature (greater than 1050° C.) and heavier phosphorus doping are required to achieve better interpoly quality on breakdown capability. However, oxidation at high temperature on heavily-doped polysilicon involves several drawbacks, such as: (1) outgassing during interpoly oxidation which causes autodoping on wafer; and (2) oxidation enhanced diffusion of phosphorus from the floating gate to the tunnel oxide, which, forms a trapping center in the oxide. The phosphorus induced trap collapses the threshold window of EEPROM cell at $10^4$ cycles. (See: R. B. Marcus et al., *J. Electrochem. Soc.*, p. 1282, June, 1982; K. Saraswat et al., *Computer-Aided Design of Integrated Circuit Fabrication Process for VLSI Device*, p. 244–290, July, 1981.) Finally, the second layer of doped polycrystalline silicon is then formed on top of the insulating layer of $SiO_2$.

Because the insulating layer of silicon dioxide is on the order of 750 Angstroms, the typical write or erase voltage, i.e., the voltage which is needed to place charges on or to remove charges off the floating gate has been high, i.e., in excess of 20 volts, which places the shrinkage limits for gate oxide thickness, junction depth and die size.

Silicon nitride ($Si_3N_4$) has also been used as an insulating layer of dual dielectric (thermal oxide with silicon nitride on it) between the floating gate and the control gate connection. Silicon nitride has the property that it is more dense than silicon dioxide and, therefore, affords higher capacitive coupling between the floating gate and the control gate. A typical dual dielectric between the floating gate and the control gate is composed of 500 Angstroms oxide and 400 Angstroms nitride. However, even with the use of silicon nitride as the insulating layer, the write and erase voltage is still relatively high, in excess of 20 volts. This is due to the problem of asperity or roughness in the surface of the floating gate. Asperity in the floating gate causes points of electrical field enhancement. Thus, a large amount of insulating material must be interposed between the floating gate and the control gate. This, however, in turn, requires that a large voltage be used. Currently in VLSI technology, there is a preference for small die size in high circuit density packages which requires a relatively high interpoly dielectric breakdown capability and interpoly capacitance.

SUMMARY OF THE INVENTION

In the present invention, a method of making an electrically programmable memory device is disclosed in which the floating gate is first formed by depositing a layer of polycrystalline silicon. Subsequently, a layer of silicon dioxide of approximately 200 Angstroms is thermally formed over the polycrystalline silicon. The layer of polycrystalline silicon is then doped by ion implantation technique in which ions are implanted through the insulating layer of silicon dioxide into the layer of polycrystalline silicon to dope it to form the floating gate. A LPCVD silicon nitride (approximately 200 Angstroms) is then deposited on the layer of silicon dioxide. Finally, a pyrogenic oxidation ($H_2/O_2$) is performed to reduce the nitride pinhole and nitride/oxide interface state.

BRIEF DESCRIPTION OF THE DRAWINGS

FIG. 1 is an enlarged cross-sectional view of an EPROM device of the prior art and an EPROM device manufactured by a method of the present invention.

FIG. 2 is an enlarged cross-sectional view of an EEPROM device of the prior art and an EEPROM device manufactured by a method of the present invention.

FIG. 3 is a cross-sectional view, greatly enlarged, of a section of the floating gate of the EPROM or EEPROM device of the prior art and superimposed thereon a section of the floating gate of EPROM or EEPROM device manufactured by a method of the present invention.

FIG. 4 is an enlarged cross-sectional view of another EPROM device manufactured by a method of the present invention.

FIG. 5 is an enlarged cross-sectional view of another EEPROM device manufactured by a method of the present invention.

DETAILED DESCRIPTION OF THE DRAWINGS

Figure 6:
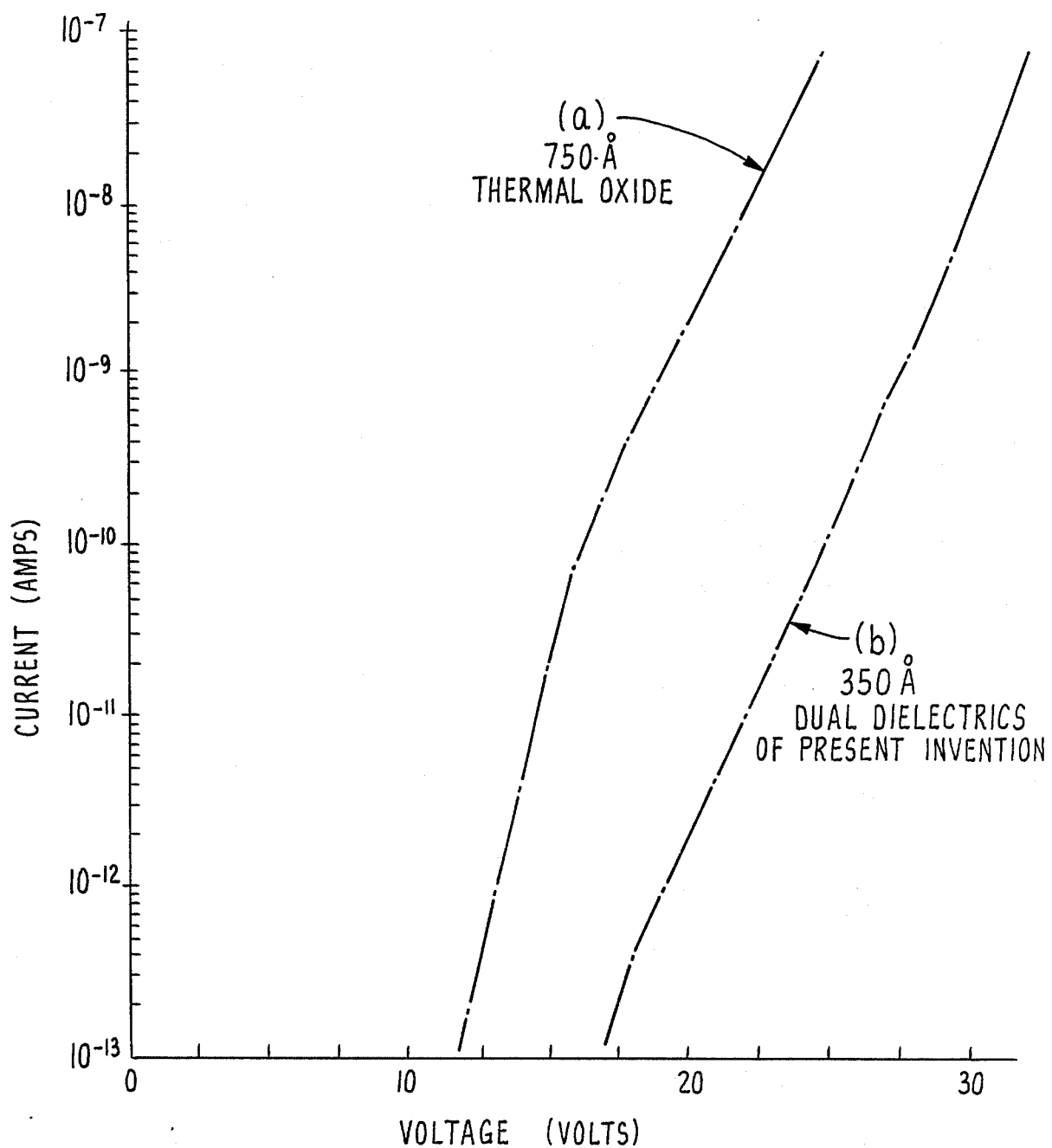
FIG. 6 is a graph showing current-voltage characteristics of a device of the prior art and a device manufactured by a method of the present invention.

Referring to FIG. 1, there is shown an EPROM 10 of the prior art. The EPROM 10 comprises a substrate 12, which is typically a single crystalline silicon of the P type having a source 14 and a drain 16 fabricated therein. A first layer 18 of insulating material, typically SiO₂, is grown on the silicon substrate 12. The first layer 18 of SiO₂ is thermally grown at approximately 1,000° C., using HCl and O₂. On the first layer 18 of SiO₂ is deposited the first layer 20 of polycrystalline silicon. The first layer 20 of polycrystalline 20 is deposited by low pressure chemical vapor deposition techniques. In a reaction chamber, SiH₄ is introduced and is reacted at approximately between 620°-670° C., depositing the layer 20 of polycrystalline silicon. The first layer 20 of polycrystalline silicon is then doped by phosphorus, rendering it conductive to form the floating gate. Phosphorus is introduced into the reaction chamber in the form of POCl₃ at 950° C. A second layer 22 of insulating material, i.e., SiO₂, is thermally grown on the floating gate 20. The second layer 22 of SiO₂ is typically on the order of 750 to 1000 Angstroms. A second layer 24 of polycrystalline is deposited on the second layer 22 of SiO₂. The second layer 24 of polycrystalline silicon is doped to form the connection for the control gate of the EPROM 10. A third layer 26 of insulating material, SiO₂, is thermally grown on the second layer 24.

Referring to FIG. 2, there is shown an EEPROM 110 of the prior art. The EEPROM 110 of the prior art is identical to the EPROM 10 of the prior art, shown in FIG. 1, except for the tunnel oxide 15 region between the drain 16 and the floating gate 20. The tunnel oxide region is typically approximately 100 Angstroms thick. This narrow, thin tunnel oxide region 15 permits electrons to tunnel to or from the drain 16 during the erase or write cycle. The fabrication of the first layer 118, second layer 22 and third layer 26 of SiO₂ and the formation of the floating gate 20 and of the control gate 24 is similar to that described for the EPROM 10 of FIG. 1. The shape of the floating gate 20 and the control gate 24 are formed by well-known prior art methods.

In the method of the present invention, the first layer 18 of SiO₂ is thermally grown on the single crystalline substrate 12 in the same manner as that for the EPROM 10 or the EEPROM 110 of the prior art. The floating gate 20, however, is formed by depositing a layer of polycrystalline silicon on the first layer 18 of SiO₂. The layer 20 of polycrystalline silicon is deposited by low pressure chemical vapor deposition technique in which SiH₄ is introduced and is reacted at approximately between 620°-670° C. The second layer 22 of SiO₂ is then thermally grown on the first layer 20 of undoped polycrystalline silicon. The second layer 22 of SiO₂ is approximately 250 Angstroms thick. Phosphorus ions are then implanted in the first layer 20 of polycrystalline silicon through the second layer 22 of SiO₂. Typically, the phosphorus ions are accelerated at 70-120 KEV to impinge the second layer 22 of SiO₂, to pass therethrough and to be deposited in the first layer 20 of polycrystalline silicon. The first layer 20 of polycrystalline silicon, doped with the phosphorus, becomes the floating gate 20. SiO₂ can then be further deposited on top of the second layer 22 of SiO₂ to increase the total thickness to approximately 400-500 Angstroms. The second layer 24 of polycrystalline silicon is then deposited on the second layer 22 of silicon dioxide in the same manner as the prior art. The second layer 24 of polycrystalline can then be doped to be conductive to form the control gate.

Referring to FIG. 3, there is shown a section of the floating gate 20 of the EPROM 10 or EEPROM 110 of the prior art (shown in solid line) and a section of the floating gate 120 of the EPROM or EEPROM made by the method of the present invention (shown in dotted lines). This is a greatly enlarged view, as typically the dimension of the floating gate is less than one micron in size.

As can be seen in FIG. 3, the floating gate 20 of the prior art shows a number of bumps (designated as A, B, C, etc.). The asperity in the floating gate 20 is attributable to the chemical phosphorus doping of the polycrystalline silicon. These bumps in the floating gate 20 form electrical field enhancement points. To prevent undesired discharge between the floating gate 20 and the control gate, the insulating layer therebetween or the second layer 22 of silicon dioxide must be relatively large (on the order of 750 Angstroms). Since $$C = E \frac{A}{T},$$

where E is the dielectric constant of the material, A is the area between the two gates, and T is the thickness therebetween, for a large T, the value of C is reduced. Furthermore, since ΔQ=CΔV for a reduced value of C, a large value of voltage V must be used to place the charge Q on or to remove it from the floating gate 20. Subsequently, the voltage to write or to erase must be large.

In contrast, with the floating gate 120 formed by the method of the present invention, the surface is relatively smooth. The doping material is not chemically introduced and does not deform the surface of the floating gate 120. Because the surface of the floating gate 120 is relatively smooth, the second layer 22 of silicon dioxide can be on the order of 400-500 Angstroms. This increases the capacitive coupling. Thus, the operating voltage for the write and erase cycles can be much lower.

The charging and discharging of the floating gate is accomplished by Fowler-Nordheim tunneling of electrons across the tunnel oxide. The tunnel current is $$J\ tunnel = \alpha \cdot E^2 \cdot e^{-\frac{\beta}{E}}$$

where E is the electric field across the tunnel oxide, α and β are constants, electrical field is $$E = \frac{V}{t}$$

where V is the voltage drop across the tunnel oxide and t is the tunnel oxide thickness. V can be calculated from the capacitive equivalent voltage divider circuit.

If we define the coupling ratio as $$\frac{V}{V\ applied},$$

during the charging state, the coupling ratio is $$\frac{C_{pp}}{C\ total}$$

where C total is the sum of interpoly capacitance (Cpp), gate oxide capacitance and tunnel oxide capacitance. Higher interpoly capacitance results in higher coupling ratio, which, results either in the reduction of charging state applied programming voltage or in shorter charging state programming time.

Referring to FIG. 4, there is shown a cross-sectional view of another EPROM 210 manufactured by a method of the present invention. The EPROM 210 comprises a single crystalline silicon substrate 212, having a source 214 and a drain 216. A first layer 218 of $SiO_2$ is on the body 212. A first layer of undoped polycrystalline silicon 220 is on the first layer 218 of silicon dioxide. The method involves depositing first layer 220 by low pressure chemical vapor deposition technique of $SiH_4$ at 620° C. The layer 220 is approximately between 3000–4500 Angstroms thick. A second layer 222 of silicon dioxide is on the first layer 220 of polycrystalline silicon. The second layer 222 is substantially between 200–250 Angstroms. The second layer 222 is formed by thermally oxidizing the first layer 220 in dry $O_2$ at approximately 1000° C. The first layer 220 of polycrystalline silicon is doped with phosphorus that has been ion implanted through the second layer of 222 of silicon dioxide. $P^{31}$ is implanted at $1-5 \times 10^5/cm^2$ at 70-120 KEV. Thereafter, the second layer 222 of silicon dioxide is bathed in sulfuric acid at 150° C. for about 10 minutes. Then, the second layer 222 is dipped in a dilute HF acid for about 5 seconds to remove contamination due to the ion implantation. The HF acid removes approximately 25 Angstroms of $SiO_2$. The dilute HF acid comprises ten parts of distilled water to one part of HF acid. The second layer 222 is then rinsed in distilled water and dried. A third layer 224 of insulating material is deposited on the second layer 222 of silicon dioxide. The third layer 224 comprises silicon nitride ($Si_3N_4$) and is deposited by low pressure chemical vapor deposition technique. $NH_3$ and $SiH_2Cl_2$ are reacted at approximately 770° C. The third layer 224 is approximately 250 Angstroms. A pyrogenic oxidation ($H_2/O_2$) cycle is then performed to reduce the nitride pinhole and nitride/oxide interface state. The pyrogenic oxidation step is accomplished by reacting $H_2$ and $O_2$ at 900° C. for about 2 hours. This automatically produces the third layer 226 of $SiO_2$ which is between approximately 30–50 Angstroms. Finally, the second layer 228 of polycrystalline silicon is then deposited on the third layer 226 of $SiO_2$. The second layer 228 of polycrystalline silicon is then doped to form the control gate.

Referring to FIG. 5, there is shown another EEPROM 310 manufactured by a method of the present invention. The EEPROM 310 of FIG. 5 is identical to the EPROM 210 shown in FIG. 4, except with the addition of a tunnel oxide region 315. In all other respects, the first, second, and third layers of insulating material (comprising the two layer of $SiO_2$ and one layer of $Si_3N_4$) and the two layers of polycrystalline silicon are identical to the similar structures for the EPROM 210 and are made in the same manner. The first layer of $SiO_2$ is approximately 750 Angstroms thick over the thick gate region and is approximately 100 Angstroms thick in the tunnel oxide region. the formation of the shape of the two layers of polycrystalline silicon and the second layer of $Si_3N_4$ is based upon well-known prior art methods.

With the EPROM 210 or the EEPROM 310, there is greater capacitive coupling betwen the control gate and the floating gate due to the silicon nitride deposited therebetween. Since silicon nitride has a higher dielectric constant, the capacitance is increased. This means that a lower operating voltage, on the order of 12 volts, can be used to write or to erase charges from the floating gate 220.

We claim:

1. An improved method of making an electrically programmable memory device of the type having a floating gate for storing charges therein, said method including the steps of
   fabricating a body of single crystalline semiconductive material;
   thermally growing a first layer of insulating material on said body of semiconductive material;
   depositing a first layer of undoped semiconductive material on said first layer of insulating material;
   wherein said improvement comprising the steps of:
   thermally growing a second layer of insulating material on said first layer of undoped semiconductive material;
   implanting a doping material through said second layer of insulating material into said first layer of semiconductive material to form said floating gate; and
   forming a second layer of conductive semiconductive material over said second layer of insulating material.

2. The method of claim 1, wherein said body of single crystalline semiconductive material and said first and second layers of semiconductive material are comprised of silicon.

3. The method of claim 2, wherein said first and second layers of silicon are polycrystalline silicon.

4. The method of claim 3, wherein said first layer of polycrystalline silicon is deposited by low pressure chemical vapor deposition.

5. The method of claim 4, wherein said doping material is phosphorus.

6. The method of claim 2, wherein said first and second layers of insulating material are comprised of silicon dioxide ($SiO_2$).

7. The method of claim 1 after said implanting step further comprising the steps of
   removing a portion of said second layer of insulating material; and
   depositing a third layer of insulating material on said second layer of insulating material with the insulating material of said third layer different from the insulating material of the second layer;
   wherein said second layer of conductive material being deposited on said third layer of insulating material.

8. The method of claim 7, wherein said body of single crystalline semiconductive material and said first and second layers of semiconductive material are comprised of silicon.

9. The method of claim 8, wherein said first and second layers of silicon are polycrystalline silicon.

10. The method of claim 8, wherein said first and second layers of insulating material are comprised of silicon dioxide ($SiO_2$).

11. The method of claim 10, wherein said third layer of insulating material is $Si_3N_4$.

12. The method of claim 10, wherein said first layer of polycrystalline silicon is deposited by low pressure chemical vapor deposition.

13. The method of claim 12, wherein said doping material is phosphorus.

14. The method of claim 13, wherein said removing step comprises exposing said second layer of $SiO_2$ to dilute HF acid.

15. The method of claim 14 further comprising the step of exposing said third layer of insulating material to pyrogenic ($H_2/O_2$) oxidation, forming a fourth layer of insulating material of $SiO_2$.

16. The method of claim 15, wherein said depositing step for the first layer of polycrystalline silicon forms approximately 3000–4500 Angstroms; said depositing step for the second layer of $SiO_2$ forms substantially between 200–250 Angstroms; said removing step removes approximately 25 Angstroms of $SiO_2$; said depositing step for the third layer of $Si_3S_4$ forms substantially 250 Angstroms; and said fourth layer is substantially 30–50 Angstroms.

17. A method of reducing asperity in the floating gate of an electrically programmable memory device, said floating gate positioned between a first layer of insulating material and a second layer of insulating material and being of a semiconductive material, doped with a dopant, where said improvement comprising
 depositing said semiconductive material on said first layer;
 thermally growing said second layer on said semiconductive material; and
 ion implanting said dopant through said second layer into said semiconductive material forming said floating gate.

18. The method of claim 17, wherein said first and second layers are of $SiO_2$; said semiconductive material is polycrystalline silicon; and said dopant is phosphorus.

* * * * *